US008710658B2

(12) United States Patent
Aboush (10) Patent No.: US 8,710,658 B2
(45) Date of Patent: Apr. 29, 2014

(54) UNDER BUMP PASSIVE COMPONENTS IN WAFER LEVEL PACKAGING

(75) Inventor: Zaid Aboush, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/299,556

(22) Filed: Nov. 18, 2011

(65) Prior Publication Data

US 2013/0127060 A1    May 23, 2013

(51) Int. Cl.
*H01L 23/48* (2006.01)
*H01L 21/78* (2006.01)
*H01L 21/768* (2006.01)

(52) U.S. Cl.
USPC ............ 257/738; 257/E23.011; 257/E21.59; 257/E21.599; 257/40; 257/737; 257/778; 257/774; 257/773; 257/758; 257/700; 257/701

(58) Field of Classification Search
USPC .......... 257/40, 737, 738, 778, 774, 773, 758, 257/700, 701, E23.011, E21.59, E21.599
See application file for complete search history.

(56) References Cited

U.S. PATENT DOCUMENTS

| | | | |
|---|---|---|---|
| 7,029,946 B2 | 4/2006 | Murata | |
| 7,161,793 B2 * | 1/2007 | Kurihara et al. | 361/306.3 |
| 7,413,929 B2 | 8/2008 | Lee et al. | |
| 7,778,009 B2 * | 8/2010 | Shioga et al. | 361/306.1 |
| 2002/0096764 A1 | 7/2002 | Huang | |
| 2005/0006688 A1 * | 1/2005 | Solo De Zaldivar | 257/306 |
| 2005/0082636 A1 * | 4/2005 | Yashima et al. | 257/532 |
| 2005/0146838 A1 * | 7/2005 | Shioga et al. | 361/306.3 |
| 2006/0284323 A1 | 12/2006 | Hashimoto | |
| 2007/0114634 A1 | 5/2007 | Lin et al. | |
| 2007/0176175 A1 * | 8/2007 | Shioga et al. | 257/40 |
| 2007/0205520 A1 | 9/2007 | Chou et al. | |
| 2008/0145996 A1 * | 6/2008 | Nomura et al. | 438/396 |

(Continued)

FOREIGN PATENT DOCUMENTS

| | | |
|---|---|---|
| JP | S61-109150 U | 7/1986 |
| JP | H10-313095 A | 11/1998 |
| JP | 2006344680 A | 12/2006 |
| KR | 1020040071158 A | 8/2004 |

OTHER PUBLICATIONS

Examination Report for German Patent Application No. 10-2012-003545.4 dated Oct. 23, 2012.

(Continued)

*Primary Examiner* — Alexander Oscar Williams
(74) *Attorney, Agent, or Firm* — Frommer Lawrence & Huag LLP; John W. Branch (57) ABSTRACT

Under bump passive structures, such as capacitors and inductors, may be formed using the post-processing layers in wafer level packaging. In an embodiment, a packaged semiconductor device is described which includes an under-bump capacitor formed in semiconductor device post-processing layers. As part of the post-processing a first dielectric layer is deposited on the active face of a semiconductor die and then in sequence a first metal layer, second dielectric layer and second metal layer are deposited. The under-bump capacitor is formed from a lower plate in the first metal layer and an upper plate in the second metal layer, the plates being separated by the second dielectric layer. In order to increase capacitance, the capacitor may be formed over one or more openings in the first dielectric layer, such that the layers forming the capacitor are no longer planar but follow the underlying topology.

12 Claims, 9 Drawing Sheets

(56) References Cited

U.S. PATENT DOCUMENTS

| | | |
|---|---|---|
| 2008/0153245 A1 | 6/2008 | Lin et al. |
| 2008/0233731 A1 | 9/2008 | Lin et al. |
| 2008/0315358 A1* | 12/2008 | Shioga et al. ............ 257/532 |
| 2010/0118468 A1* | 5/2010 | Nomura et al. ........... 361/313 |
| 2010/0203655 A1* | 8/2010 | Ayotte et al. ............... 438/17 |
| 2011/0062549 A1 | 3/2011 | Lin |

OTHER PUBLICATIONS

Search Report for British Patent Application No. GB1201735.6 dated Dec. 20, 2012.

* cited by examiner

FIG. 1    PRIOR ART

PRIOR ART

UNDER BUMP PASSIVE COMPONENTS IN WAFER LEVEL PACKAGING

BACKGROUND

Advances in techniques for packaging semiconductor die are being driven by the market for smaller, lower cost electronic devices with increasing functionality. Chip scale packaging (CSP) encompasses a number of different packaging techniques where the size of the packaged die is only slightly larger than the size of the die itself.

In wafer level chip scale packaging (WLCSP), also referred to as wafer level packaging (WLP), the solder balls (or bumps) are formed directly on the semiconductor wafer, before the wafer is diced into individual die. This results in a very compact packaged die and enables wafer scale testing of packaged die, which may have cost and efficiency benefits. A variation of WLP is Embedded Wafer Level Ball Grid Array (eWLB) or Fan Out WLP (FOWLP, also referred to as Fan Out CSP). This packaging technology allows for a large number of connections by creating an artificial (or reconstituted) wafer that can then be post-processed using standard WLP techniques. The artificial wafer is formed by over-molding the diced semiconductor die which are held on a carrier and spaced by a distance which is typically larger than the spacing on the original silicon wafer. When the artificial wafer is diced, the die size is larger than the size of the semiconductor die, thus providing additional space for routing tracks and solder balls.

The embodiments described below are not limited to implementations which solve any or all of the disadvantages of known WLP methods.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Under bump passive structures in wafer level packaging and methods of fabricating these structures are described. In an embodiment, a packaged semiconductor device is described which includes an under-bump capacitor formed in semiconductor device post-processing layers. As part of the post-processing a first dielectric layer is deposited on the active face of a semiconductor die and then in sequence a first metal layer, second dielectric layer and second metal layer are deposited. The under-bump capacitor is formed from a lower plate in the first metal layer and an upper plate in the second metal layer, the plates being separated by the second dielectric layer. In order to increase capacitance, the capacitor may be formed over one or more openings in the first dielectric layer, such that the layers forming the capacitor are no longer planar but follow the underlying topology.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1:
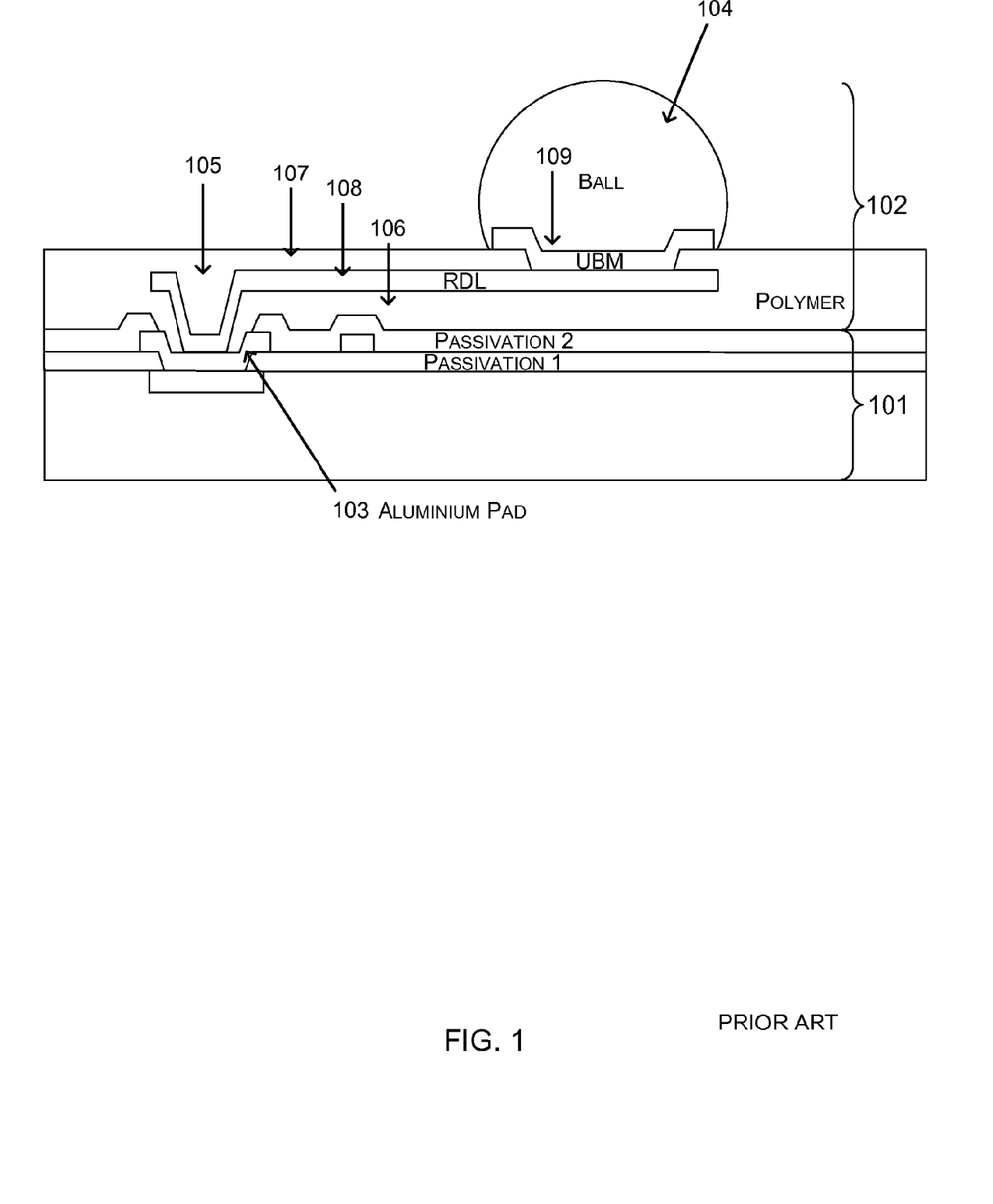
FIG. 1 is a cross-section through a known WLCSP device.
Figure 2:
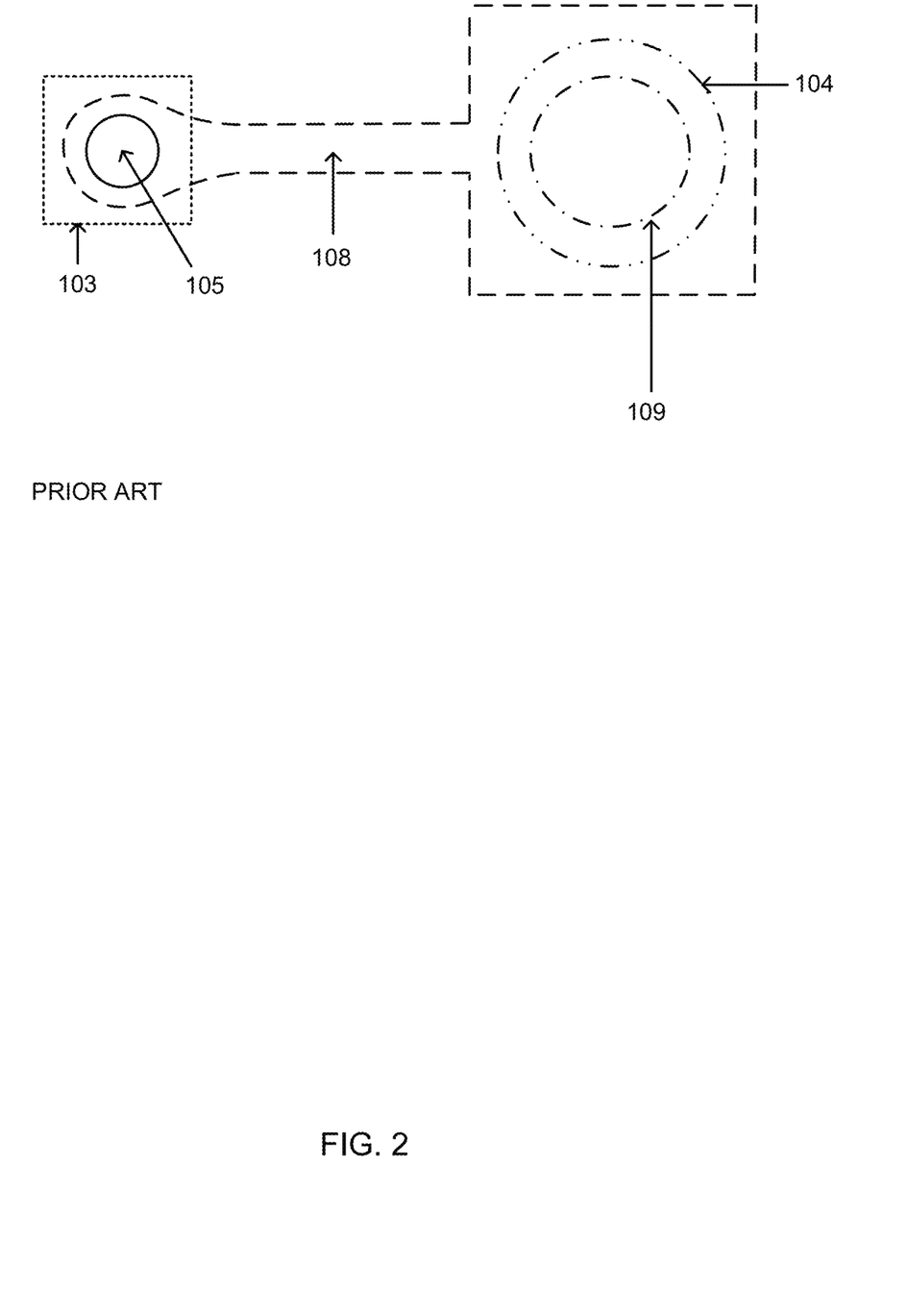
FIG. 2 is a plan view of a known WLCSP device, such as is shown in FIG. 1.

An example of a known method of wafer level chip scale packaging is shown in FIGS. 1 and 2. FIG. 1 shows a cross-section view through a WLCSP which comprises a semiconductor die 101 which has been further processed through the addition of a number of layers of material 102 onto the active face of the die. This further processing may be referred to as 'post-processing'. It will be appreciated that for purposes of clarity, not all layers have been shown within the semiconductor die 101. In order to provide an electrical connection between a pad 103 on the die and the solder ball 104, an encapsulated via 105 in a lower of two polymer layers 106, 107 is used. This via 105 is not positioned directly underneath the solder ball 104 but instead is outside the area of the solder ball. FIG. 2 is a corresponding plan view showing the pad 103, the via 105 through the lower polymer layer 106 and the track 108 connecting the pad 103 to the solder ball 104. FIG. 2 also shows the via 109 in the upper polymer layer 107 which provides the electrical connection between the track 108 and the solder ball 104.

Figure 3:
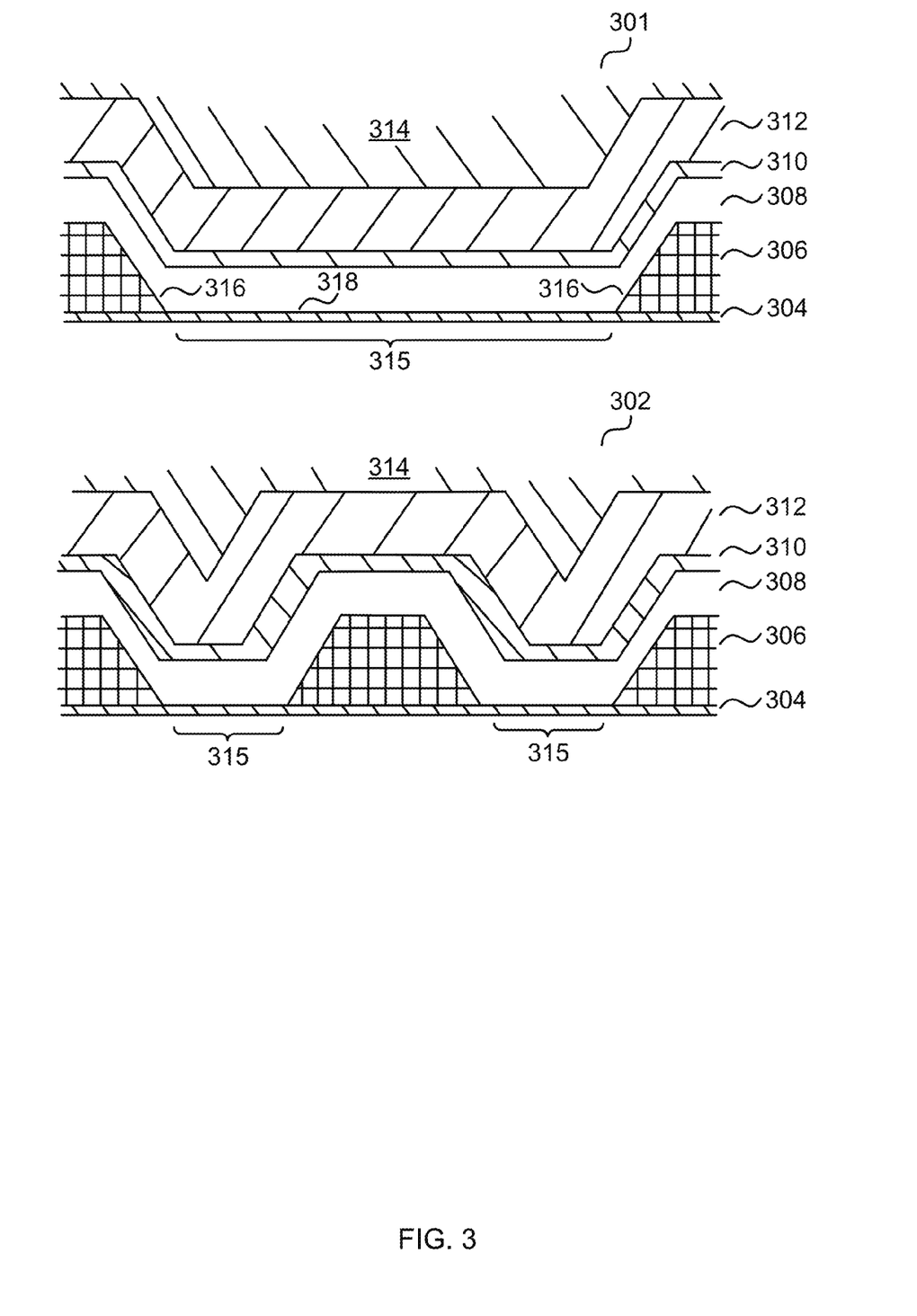
FIG. 3 is a schematic diagram of two improved under-bump structures.

FIG. 3 shows two improved under-bump structures 301, 302 which are formed in the additional layers of material which are deposited onto the active face of a semiconductor wafer (and which may alternatively be referred to as under-ball structures) and which are used to form passive components. As described in more detail below, these structures use a standard Wafer Level Chip Scale Package (WLCSP) process to realize a capacitor under the solder ball. Therefore, the off-chip bill of materials can be reduced and consequently cost. Also, having the capacitor near the die can enhance chip performance. The proposed capacitor has very low inductive parasitic and hence it is broadband in nature. The new structure can also inherently provide better thermal dissipation to cool die hot spots such as power amplifiers.

The under-bump structures are formed on a semiconductor wafer which comprises a plurality of semiconductor die. Both the structures 301, 302 are shown in cross-section and for the purposes of clarity most of the layers within the semiconductor die itself have been omitted, although the passivation layer 304 on the surface of a semiconductor die is shown. Four post-processing layers are shown: a first dielectric layer 306

(which is deposited onto the passivation layer 304), a first metal layer 308 (which is deposited on top of the first dielectric layer 306), a second dielectric layer 310 (which is deposited on top of the first metal layer 308) and a second metal layer 312 (which is deposited on top of the second dielectric layer 310). The solder ball 314 may be dropped on top of the second metal layer 312 (which may be referred to as the 'under-bump metallization' or UBM) and once reflowed the solder ball extends to the edge of the second metal layer 312 (because the solder wets to the UBM and does not wet to the second dielectric layer 310 which is the exposed layer where there is no second metal layer 312). Alternatively, solder paste may be deposited and then reflowed to form solder ball 314. In a further example (known as Land Grid Array, LGA, WLCSP), the solder paste may not be deposited at this stage (i.e. the solder ball 314 may be omitted from the structures shown in FIG. 3) and instead the solder paste may be printed onto the PCB prior to the post-processed semiconductor die being attached and then connections made by reflowing the solder. It will be appreciated that the dimensions of the structures shown in FIG. 3 are not to scale and the relative layer thickness and slopes (i.e. angles) of edges may be different to that shown.

It will be appreciated that the dielectric layers 306, 310 may be formed from polymer, polyimide or any other dielectric material.

In both improved under-bump structures 301, 302 shown in FIG. 3, it can be seen that at least one area (indicated by bracket 315) of the first dielectric layer 306 has been removed in the structure below the solder ball 314, this area which has been removed is also referred to herein as an opening (or hole) in the dielectric layer. In the first example there is a single large area which has been removed (which may be a significant proportion of the area underneath the solder ball) and in the second example there are two smaller areas shown. In further examples (as described below) there may be an array of small areas underneath the solder ball 314 where at least a part of the first dielectric layer 306 has been removed. As a result of this removal of some of the first dielectric layer 306, the first metal layer 308 (which is deposited onto the first dielectric layer 306) has regions which are on top of the first dielectric layer 306 and also has regions which are deposited down the sloping edges 316 of the first dielectric layer and along the bottom 318 of the opening. The opening in the first dielectric layer 306 therefore has the effect that the first metal layer 308 is no longer planar across the area underneath the solder ball but instead follows the underlying topology. This contrasts with the structure shown in FIG. 1, where the first metal layer 308 is substantially planar (i.e. within process variation) in the entire region underneath the solder ball. As is shown in the examples in FIG. 3, an area of the first metal layer 308 under the solder ball 314 covers the opening 315 in the first dielectric layer 306 completely and there is a continuous electric connection in the step from the portion of the first metal layer which is deposited on top of the full thickness of the first dielectric layer to the portion of the first metal layer which is deposited at the bottom of the opening and in contact with the passivation layer 304.

In both the examples shown in FIG. 3, the full thickness of first dielectric layer 306 is removed in the areas 315 such that the first metal layer 308 (which may also be referred to as the 'redistribution layer' or RDL) is in contact with the underlying passivation layer 304 on the surface of the semiconductor die. However, in other examples, the full thickness of the first dielectric layer 306 may not be removed, leaving a thinner layer of the first dielectric layer 306 under the first metal layer 308 in the area 315 and on top of the passivation layer 304. Where the full thickness of the first dielectric layer 306 is removed, the passivation layer 304 which is an insulator, may prevent an electrical short circuit with the top metal layer on the semiconductor die, although in some examples, there may be openings in the passivation layer 304 such that the first metal layer 308 and the top metal layer on the die are in contact. As described below, the first dielectric layer 306 may be removed by dry or wet etch processes and it is the etching process which determines the angle of the sloping walls 316.

In the improved under-bump structures 301, 302 shown in FIG. 3, it can be seen that the layers above the first dielectric 306 and first metal layer 308 also follow the contours of these underlying layers (i.e. they also follow the underlying topology). Each of the under-bump structures 301, 302 is described in more detail below.

Figure 4:
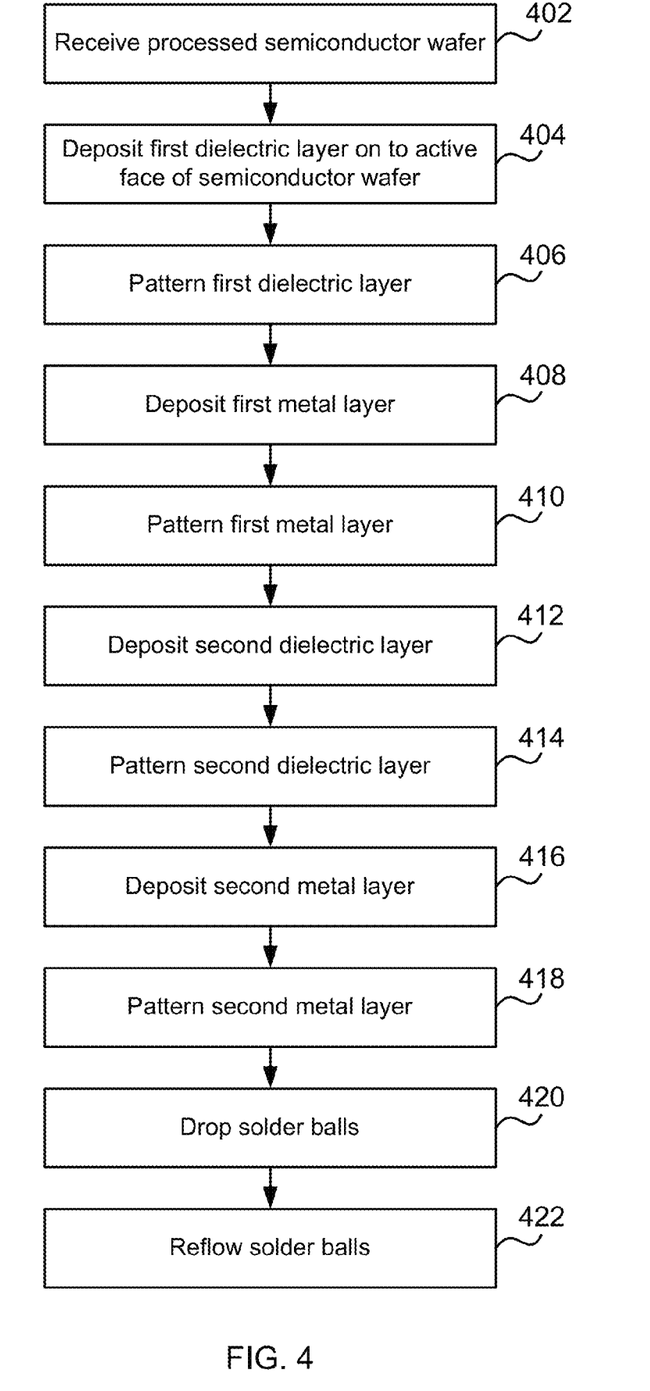
FIG. 4 shows an example process flow for fabrication of the structures shown in FIG. 3.

FIG. 4 shows an example process flow for fabrication of the structures shown in FIG. 3. In the process flow shown it can be seen that the process involves pairs of steps: a layer is first deposited and then patterned. It will be appreciated, however, that in a variation of the method shown, a layer may be deposited only in the areas required, for example using photolithography and lift-off techniques. It will also be appreciated that there may be other steps in the process which are not shown in FIG. 4, such as etching stages prior to deposition stages in order to clean/prepare the surface onto which a layer is deposited.

In the process flow shown in FIG. 4, the deposition of layers uses the standard WLCSP or WLP process (including standard layer thicknesses) and the differences lie in the patterning of the layers (e.g. in the design of the masks used to pattern layers, for processes which use masks). A processed semiconductor wafer is received (block 402) and a first dielectric layer is deposited onto the active face of the wafer (block 404). The thickness of the first dielectric layer may, for example, be the standard thickness for a WLCSP/WLP process (e.g. a few microns thick). When this layer is patterned (in block 406), additional material is removed in areas which will be underneath the solder ball in the completed structure. As described above, there may be a single large area where material is removed under a solder ball, or there may be multiple smaller areas under a solder ball. Where material is removed (e.g. in areas 315), the full thickness of the first dielectric layer may be removed (e.g. as shown in the examples of FIG. 3) or a reduced thickness of the first dielectric layer may remain on top of the active face of semiconductor wafer (i.e. on top of the passivation layer).

A first metal layer is then deposited onto the first dielectric layer (step 406) and patterned (block 408) to form tracks, lands and other areas of metal. As shown in FIG. 3 and described above, the area of first metal layer which extends across the areas where the first dielectric layer was removed will be non-planar and will coat the sloping edges of the first dielectric layer. A second dielectric layer is then deposited (block 412) and patterned (block 414) to form openings which are subsequently covered by the second metal layer (in block 416) to provide electrical connections between the first and second metal layers. In the examples described herein (e.g. as shown in FIG. 3), the standard opening in the second dielectric layer under the solder ball (to form via 109 in FIG. 1) is omitted such that there is a layer of second dielectric between the two metal layers. In the structures shown in FIG. 3 (examples 301, 302), there is a full thickness layer of second dielectric between the two metal layers; however in some examples the patterning step (block 414) may selectively remove material from the second dielectric layer in an area above the opening in the first dielectric layer to leave a reduced thickness layer of second dielectric between the first and second metal layers.

A second metal layer is then deposited onto the first dielectric layer (step 416) and then patterned (block 418) to form tracks, lands etc. In particular, the patterning of the second metal layer provides lands where solder balls are to be located. As shown in FIG. 3, these lands are non-planar and follow the contours of the underlying layers. Solder balls may then be dropped onto the second metal layer (step 420) and reflowed (block 422). Alternatively, where solder paste is used, the solder paste may be deposited and then reflowed or the solder paste may be deposited later and so blocks 420 and 422 may be omitted (as in LGA WLCSP, as described above).

In the first under-bump structure 301 shown in FIG. 3, a parallel plate capacitor is realized between the first and second metal layers 308, 312. There is no opening in the second dielectric layer 310 (as would always be present in the standard structures to form via 109 as shown in FIG. 1) and instead there is a substantially uniform thickness dielectric layer 310 (i.e. to within process variation) between the two metal layers 308, 312. As described above, this layer may be the full thickness of the second dielectric layer or may be a reduced thickness layer. As described above, the passivation layer 304 is an insulator, there is no electrical short between the first metal layer 308 and the top metal layer on the semiconductor die.

Figure 5:
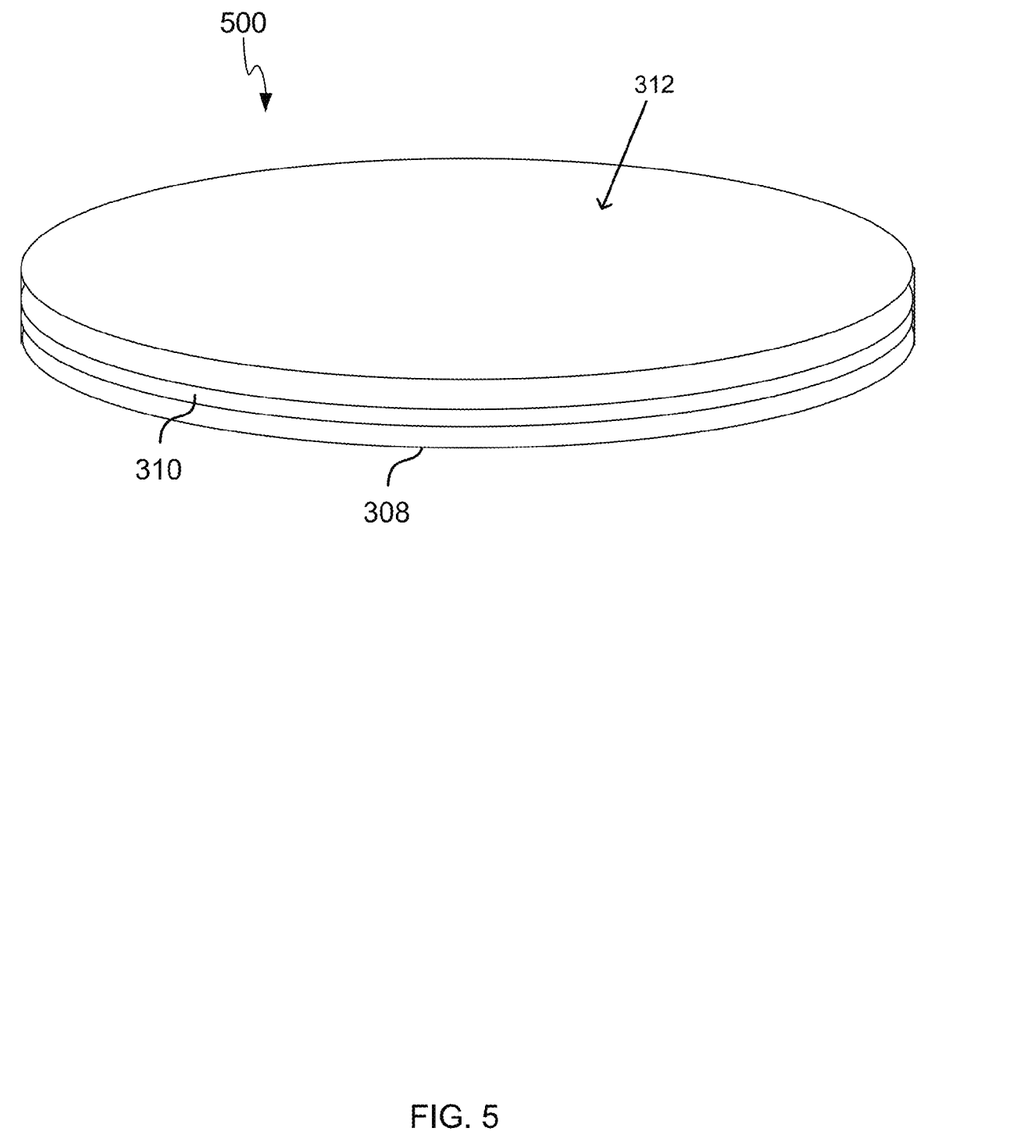
FIG. 5 shows a schematic diagram of another improved under-bump structure.

FIG. 5 shows a schematic diagram of another improved under-bump structure 500 in which only three layers are shown: the first metal layer 308, the second dielectric layer 310 and the second metal layer 312. This under-bump structure 500 also realizes a parallel plate capacitor between the first and second metal layers 308, 312; however all of the layers are planar because there is no opening in the first dielectric layer 306 underneath the capacitor structure. Instead there is a full thickness layer of the first dielectric layer underneath the first metal layer 308 and on top of the passivation layer.

Compared to the under-bump structure 500, the first example 301 shown in FIG. 3 starts to use the vertical depth of the WLCSP (or WLP) structure to increase the parallel plate surface area and hence the capacitance. The parallel plate surface area is increased further by having multiple areas 315 where the first dielectric layer is removed or substantially thinner within the under-bump structure. The second example 302 in FIG. 3 shows two areas 315 but in further examples there may be many more areas and in some examples there may be an array of cells underneath the solder ball, where each cell has a structure which resembles that of the first example 301 in FIG. 3.

Figure 6:
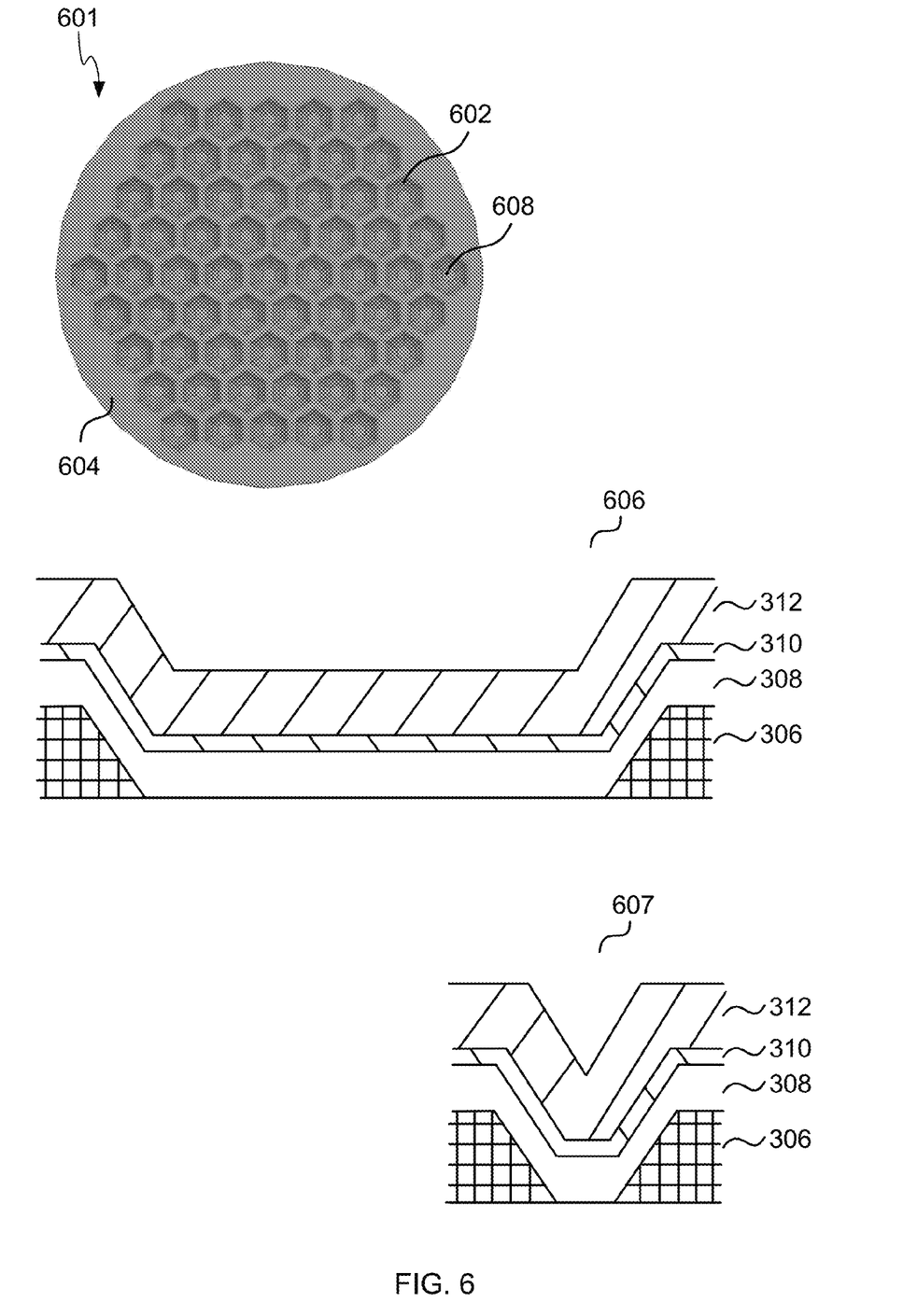
FIG. 6 shows an example of an under-bump structure which comprises an array of substantially hexagonal cells.

FIG. 6 shows an example 601 of an under-bump structure which comprises an array of hexagonal cells 602 within one circular under-bump land 604 of the second metal layer 312. Two alternative cross-sections 606, 607 through a single cell are also shown in FIG. 6. Hexagonal cells provide just one example of a suitable cell shape and such cells tessellate and so can be packed closely together within the array and utilize fully the area of the under-bump land 604. This provides a higher capacitance density. Other shape cells may alternatively be used (e.g. squares or circles) and in some examples the cells may tessellate and in other examples, shapes which do not tessellate may be used. It will also be appreciated that although the mask structures may have straight edges and sharp corners, the resultant structure on the wafer may have corners which are more rounded as a result of process capability and resolution and so any reference to hexagonal cells includes cells which are substantially hexagonal (e.g. to within process limitations). The structure shown in FIG. 6 may be referred to as a honeycomb cell array.

Any suitable cell size (and shape) may be used: the minimum cell size is process dependent and smaller cells can be produced if the sloping side walls of the layers are closer to vertical (in the examples shown, the side walls are at around 60°). Consequently, the maximum possible cell count for a given shape of cell may be increased or decreased depending on the process non-linearity (which results in the side wall slope). In the under-bump structure 601 shown in FIG. 6, there is a horizontal (or flat) portion 608 of the second metal layer 312 at the centre of each cell, as also shown in the first cross-section 606. To further reduce the cell size, this horizontal portion may be omitted, as in the second example cross-section 607 in FIG. 6 such that the second metal layer 312 has a v-shaped cross-section. A further example of this v-shaped structure is shown in the second example 302 shown in FIG. 3 in which the upper surface of the second metal layer 312 is v-shaped such that although there is a horizontal portion of the lower surface of the second metal layer, there is no horizontal portion of the upper surface or of the layer itself.

Although FIG. 6 shows the array of cells covering the entire area of the solder ball (as defined by the edge of the land 604 in the second metal layer 312), in other examples, the cells may only cover a portion of the solder ball area or there may be a single cell which covers only a portion of the solder ball area.

Figure 7:
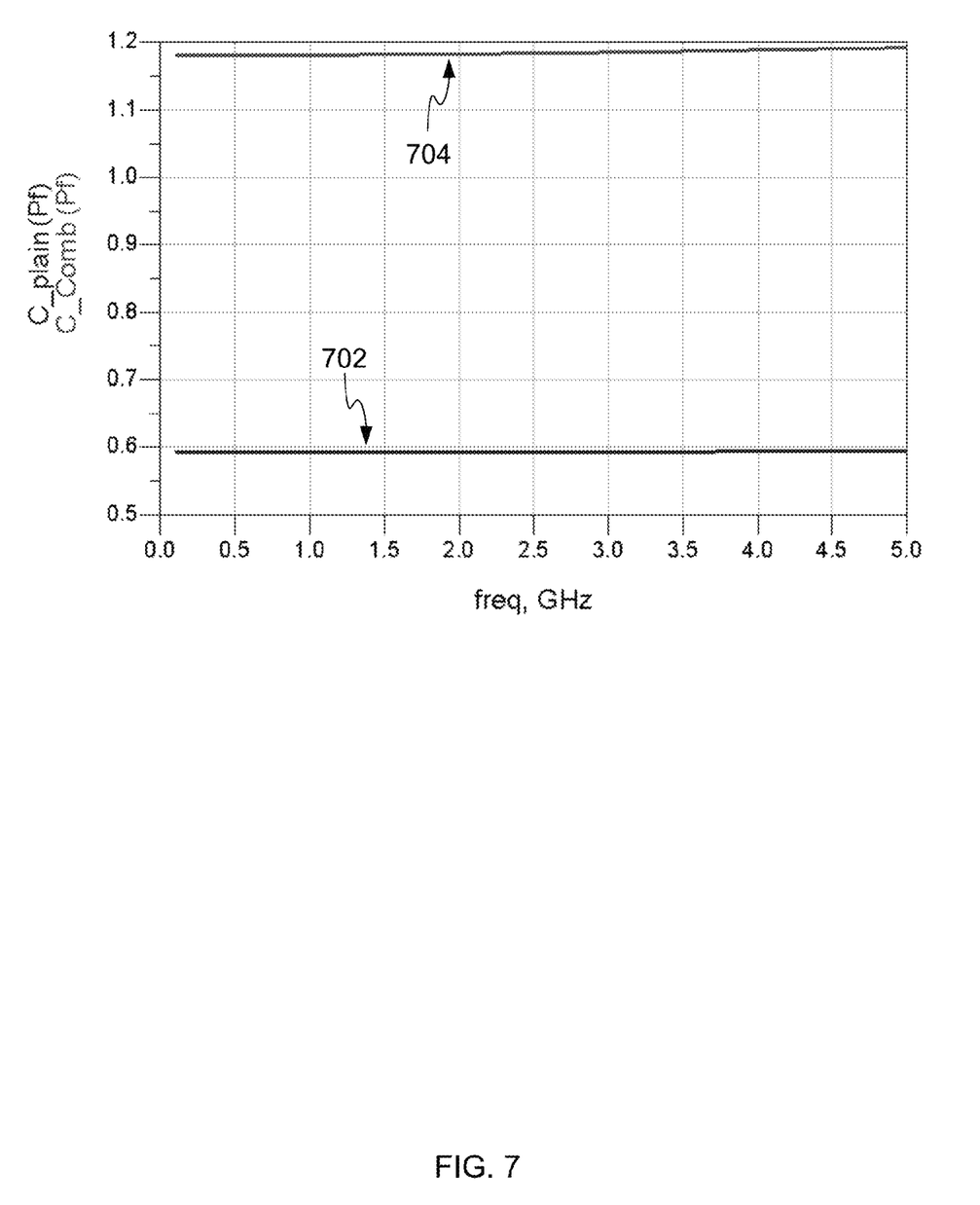
FIG. 7 is an example graph of simulation results for the under-bump capacitance structures shown in FIGS. 5 and 6.

FIG. 7 is an example graph of simulation results for the under-bump capacitance structures shown in FIGS. 5 and 6. The lower trace 702 corresponds to the planar structure shown in FIG. 5 with a diameter of 300 µm and it can be seen that this gives a capacitance of around 0.6 pF. In contrast, the upper trace 704, which corresponds to the honeycomb structure 601 shown in FIG. 6 (which also has a diameter of 300 µm), indicates a significantly higher capacitance of close to ~1.2 pF. The change in structure, within an identical size solder bump area and with identical metal layer thicknesses, results in a doubling of the capacitance which can be achieved. The traces shown in FIG. 7 are very flat over the range of frequencies shown. These results therefore also show that the new under-bump capacitance structure, in any of the variations described above, has very low inductive parasitic (ESL) and hence the device is inherently broadband. This compares to surface mount devices which typically resonate at 2 GHz (10 pF)-6 GHz (1 pF). As the cell size is reduced further (e.g. as a result in an improvement in processing capability), the capacitance which is achievable will increase, but the self-resonance frequency will decrease. As a result, for some applications, there may be a trade off between high capacitance and resonant frequency.

The capacitance values which can be obtained within a 300 µm diameter under-bump structure in WLCSP/WLP is sufficient for many applications and in particular for RF applications. In some example applications, the use of an under-bump capacitor as described herein may eliminate the need for an external PCB capacitor and hence reduce the off chip number of components, PCB area and associated assembly requirements. This also increases manufacturing yield and reduces overall cost.

Figure 8:
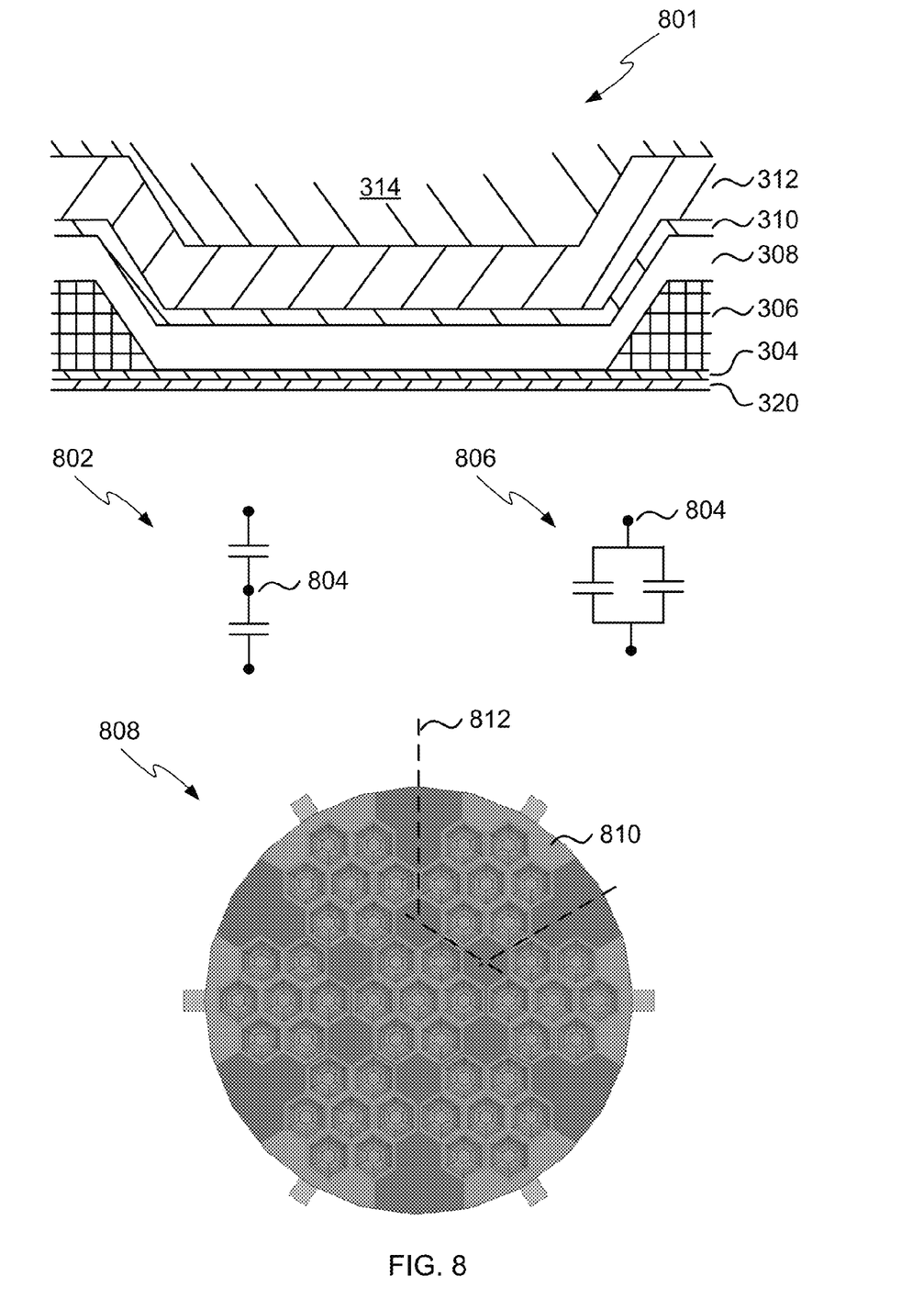
FIGS. 8 and 9 show schematic diagrams of other improved under-bump structures and their equivalent electrical circuits.

In a further variation of an under-bump capacitor structure 801, another capacitor may be formed between the lower surface of the first metal layer 308 and the die top metal 320, as shown in FIG. 8 (e.g. with the passivation layer 304 as the dielectric layer). FIG. 8 also shows the equivalent electrical circuit 802 and in order that the presence of the second capacitor (between the first metal layer 308 and the top die metal layer 320) increases rather than decreases the total capacitance, the capacitor network may be fed from point 804 (the first metal layer 308) such that the capacitors are in parallel rather than in series (as shown in circuit 806). In a variation of that shown in structure 801, a thinned layer of the first dielectric 306 may remain underneath the bump such that the dielectric in the second capacitor (between the first metal layer 308 and top die metal layer 320) is formed from both this thin layer of first dielectric 306 and the passivation layer 304.

In another variation, shown in example 808 in FIG. 8, a plurality of capacitors may be realized under each bump and connected in a star routing configuration with the star node at the bump or the second metal layer. Each of the partitioned capacitors 810 (where the partitioning is shown by dotted lines 812) are connected in a star connection in the second metal layer 312.

Figure 9:
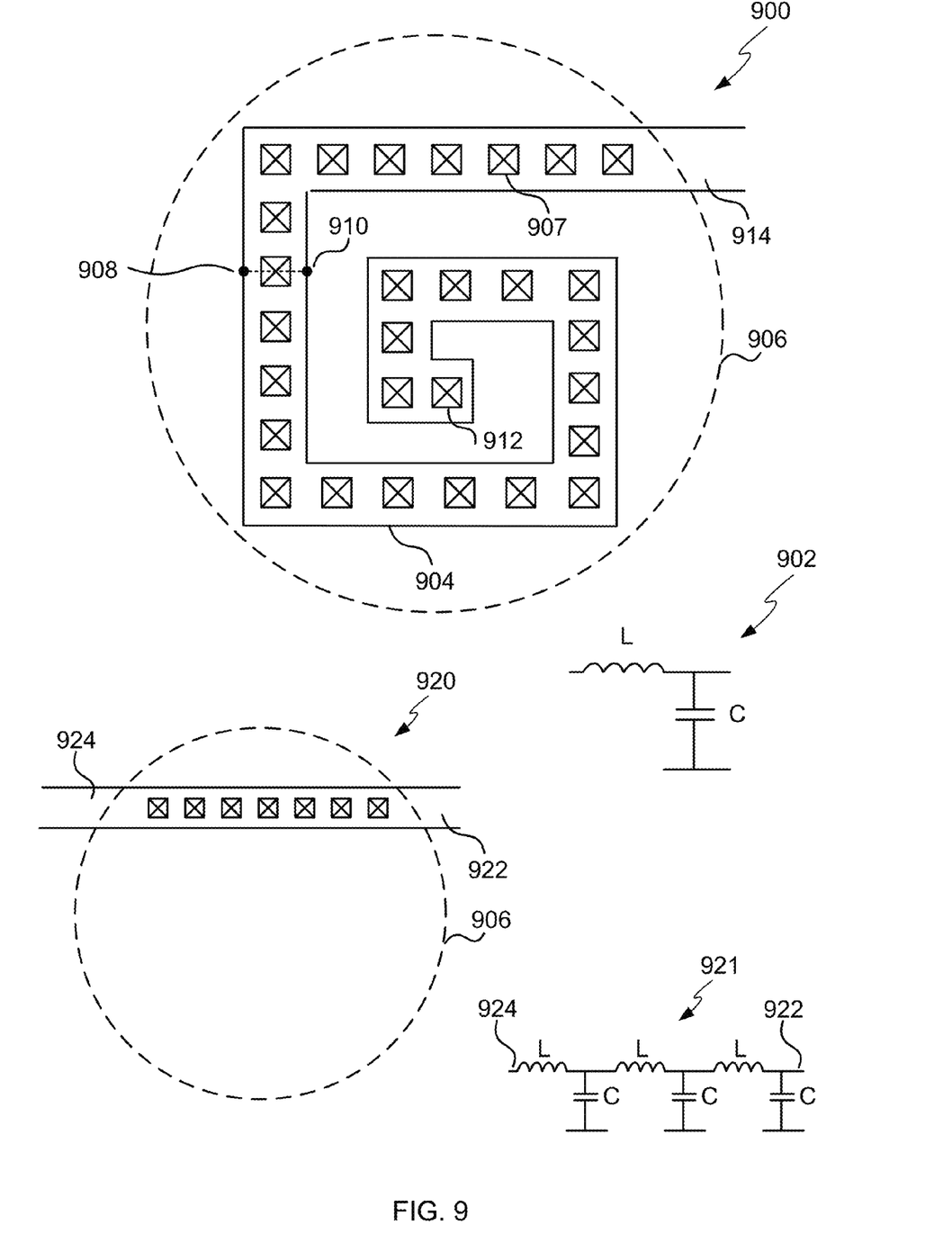

In yet a further variation of the under-bump capacitor structures described above, the capacitors may be combined with an inductor formed in the first metal layer 308 to form efficient LC networks (e.g. to provide a filter). FIG. 9 shows a further example under-bump structure 900 and the equivalent electrical circuit 902. The structure shows a spiral shaped track 904 formed in the first metal layer 308 which forms the inductor and which is underneath a circular land 906 formed in the second metal layer 312. As described above, a capacitor is formed from the two metal layers which are separated by the second dielectric layer 310. The capacitor structure may comprise multiple cells 907 as described above, such that a cross-section through the structure between points 908 and 910 may be as shown in the cross-section examples 606, 607 in FIG. 6. Alternatively, there may be a planar layer of first dielectric underneath the first metal layer, in a similar manner to the structure shown in FIG. 5. Connections to the spiral inductor 904 may be by vias in the second dielectric layer 310 connecting the first and second metal layers or by vias in both the first dielectric layer 306 and the passivation layer, which connect the first metal layer and the top metal layer of the semiconductor die. In an example, a via in the first dielectric and opening in the passivation may connect the centre of the spiral (e.g. in the region indicated by arrow 912) to the top metal layer on the die and the other end of the track 914 may extend to another solder ball where it may be connected by means of a via in the second dielectric layer 310 to the second metal layer 312.

It will be appreciated that although FIG. 9 shows a spiral shaped track, tracks of other shapes may alternatively be used to form inductors.

An LC network, such as shown in FIG. 9, may be used to provide matching or bandstop/bandpass filters very close to the die and may, for example, be used to filter high frequency harmonics at an output from the die. Wide range of inductor values can be fabricated using the methods described above and current WLCSP/WLP processes and such components are suitable for use in many applications, including RF applications. As such processes improve and minimum feature size reduces, larger capacitances may be realized. This technique allows matching networks to be buried within the under-bump structure. This technique may also allow inductors to be fabricated within the under-bump structure which replace on-chip (or on-die) inductors. This would result in a saving in die areas because for high frequency applications, the areas in the die under the on-die inductor must be kept clear of active circuitry. This would not be necessary for inductors formed in the under-bump structure as it is sufficiently far away from the die and so additional area is available within the die for active circuitry. Alternatively, this may reduce the size of the die (which in turn reduces die cost). Furthermore, such inductors which are formed in the first metal layer 308 have a high Q value (e.g. Q=38-40) when compared to on-die inductors (e.g. Q=13-14) because of the low losses of the structure. Use of such an LC filter circuit may also reduce the need for components on the PCB, e.g. by realizing the LC network in the under-bump structure. This reduces and/or simplifies the requirements for external passive components which results in reduced cost and increased yield. In further variations, more than one under-bump structure, such as shown in the figures and described above, may be interconnected electrically to realize more complex LC networks.

Multiple sections of the LC circuit 902 shown in FIG. 9 may be used to emulate a transmission line with a certain impedance, as shown in the second example structure 920 in FIG. 9 and equivalent circuit diagram 921. Using such a structure a transmission line can be realized (e.g. between points 922 and 924) underneath the ball (indicated by dotted outline 906) and hence minimize any discontinuity between the die and the outside world such as antenna.

Complex passive networks may also be formed using the methods described above (e.g. as shown in FIGS. 8 and 9) which include a connection between the second metal layer 312 and the top die metal layer 320 underneath a solder bump. Such a connection can be realized through forming openings in all the dielectric layers (e.g. the first and second dielectric layers 306, 310) underneath the solder bump and the passivation layer 304. There may also be an opening in the first metal layer 308 such that the second metal layer 312 and die top metal layer 320 contact directly or there may be electrical contact through the first metal layer 308. Such a via structure increases routing freedom when designing an LC network.

As described above, in order to create the under-bump passive components, the masks used to pattern one or more dielectric layers (e.g. in block 406 and/or block 412 of FIG. 4) are changed (i.e. to include new openings in a dielectric layer) but the process used is unchanged from standard WLCSP/WLP processes. In some examples, the masks used to deposit one or more of the metal layers (e.g. in block 410 and/or block 418 of FIG. 4) may be changed (e.g. as in the example shown in FIG. 9) but in other examples, the patterning of the metal layers may remain unchanged.

It will be appreciated that the structures and methods described above are applicable to WLCSP, eWLB (or FOWLB) or other forms of WLP. Where eWLB is used, the layers are deposited onto the artificial (or reconstituted) wafer rather than the processed silicon wafer before dicing, such that the flow diagram shown in FIG. 4 would be modified by replacing block 402 with a step of receiving an artificial (or reconstituted) wafer. The method would then proceed as shown in FIG. 4 and described above; however the capacitance area is limited to the active die area only. As described above, it is not necessary to alter the layer structure of the WLP post-processing to form the under-bump structures described herein, instead only the patterning of the layers is changed (e.g. through changing the mask designs which are used to create additional openings in layers, such as the first dielectric layer, or to define more detailed structures, such as an under-bump inductor in the first metal layer). In some implementations, however, the layer structure may be changed.

Although the examples shown in the figures and described above show a WLCSP process with two metal layers, the methods and structures described herein may be extended to comprise any number of metal layers and the capacitor structures may be formed between any two or more metal layers in such a structure or any combination of layers.

The under-bump structures described above may result in improved device performance (e.g. due to the position where capacitors and/or inductors can be placed) improved thermal performance (e.g. due to the close proximity of the first metal layer with the chip top metal layer and also the possibility of connecting the first metal layer and the chip top metal layer by introducing openings in the passivation layer), and/or reduced device cost. Where external components are reduced, this results in a reduced bill of materials (BOM) for a manufacturer which in turn can reduce package size, reduce the risk of assembly (by increasing the compound yield) and/or reduce cost.

Any range or device value given herein may be extended or altered without losing the effect sought, as will be apparent to the skilled person. Although various examples are described with reference to FIGS. 3-9, aspects from the different examples may be combined in any way and the method shown in FIG. 4 may be used to fabricate any of the structures described herein.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A packaged semiconductor device comprising:
   a semiconductor die; and
   a plurality of post-processing layers deposited onto an active face of the semiconductor die, the plurality of post-processing layers comprising: a first dielectric layer, a first metal layer, a second dielectric layer and a second metal layer deposited sequentially, with the first dielectric layer formed on the active face of the semiconductor die and the first and second metal layers patterned to form tracks and lands;
   wherein the second metal layer comprises a plurality of lands for solder bumps, and the packaged semiconductor device further comprising:
      a capacitor underneath at least one land for a solder bump, the capacitor comprising a layer of the second dielectric between the land in the second metal layer and an area of the first metal layer.

2. The packaged semiconductor device according to claim 1, further comprising at least one opening in the first dielectric layer under the capacitor such that the area of the first metal layer in the capacitor covers an edge of the first dielectric layer and at least a portion of the area of the first metal layer is in contact with the active face of the semiconductor die.

3. The packaged semiconductor device according to claim 2, comprising an array of openings in the first dielectric layer under the capacitor such that the area of the first metal layer in the capacitor covers each opening and a portion of the first metal layer is in contact with the active face of the semiconductor die within each opening.

4. The packaged semiconductor device according to claim 3, wherein within the capacitor, the second dielectric layer and the land in the second metal layer follow a topology of the area of the first metal layer resulting from the openings in the first dielectric layer.

5. The packaged semiconductor device according to claim 3, wherein each opening in the first dielectric layer is hexagonal.

6. The packaged semiconductor device according to claim 2, the semiconductor die comprising a top metal layer covered by a passivation layer on the active face and the packaged semiconductor device further comprising a second capacitor underneath the capacitor, the second capacitor comprising the area of the first metal layer and an area of the top metal layer and the passivation layer between the two areas of metal.

7. The packaged semiconductor device according to claim 6, wherein, in use, the capacitors are fed from the first metal layer.

8. The packaged semiconductor device according to claim 1, wherein the area of the first metal layer in the capacitor comprises a spiral shaped track, said spiral shaped track forming an inductor.

9. The packaged semiconductor device according to claim 8, further comprising a plurality of capacitors and inductors interconnected by tracks in the first or second metal layers to form an LC network.

10. A packaged semiconductor device comprising:
    a semiconductor die; and
    a plurality of post-processing layers deposited onto an active face of the semiconductor die, the plurality of post-processing layers comprising: a first dielectric layer, a first metal layer, a second dielectric layer and a second metal layer deposited sequentially, with the first dielectric layer formed on the active face of the semiconductor die and the first and second metal layers patterned to form tracks and lands;
    wherein the second metal layer comprises a plurality of lands for solder bumps and the first dielectric layer comprises an array of openings in the layer underneath a land for a solder bump, and the packaged semiconductor device further comprising:
       a capacitor underneath at least one land for a solder bump and over an array of openings in the first dielectric layer, the capacitor comprising a layer of the second dielectric between the land in the second metal layer and an area of the first metal layer and wherein the layers in the capacitor are non-planar and follow a topology over the array of openings in the first dielectric layer such that a portion of the first metal layer is in contact with the active face of the semiconductor die within each opening and another portion of the first metal layer is in contact with the first dielectric layer between openings.

11. The packaged semiconductor device according to claim 10, wherein the array of openings comprise an array of hexagonal openings.

12. The packaged semiconductor device according to claim 10, wherein the area of the first metal layer in the capacitor comprises a shaped track, said shaped track forming an inductor.

* * * * *